United States Patent
Bier

(10) Patent No.: US 7,102,431 B2
(45) Date of Patent: Sep. 5, 2006

(54) METHOD FOR GENERATING A HIGH-POWER ALTERNATING VOLTAGE THAT FOLLOWS AN INPUT DATA SYSTEM

(76) Inventor: Günther Bier, Dresdner Strasse 49/5/4, 1200 Vienna (AT)

( * ) Notice: Subject to any disclaimer, the term of this patent is extended or adjusted under 35 U.S.C. 154(b) by 0 days.

(21) Appl. No.: 10/498,586

(22) PCT Filed: Dec. 5, 2002

(86) PCT No.: PCT/AT02/00338

§ 371 (c)(1),
(2), (4) Date: Jun. 10, 2004

(87) PCT Pub. No.: WO03/055058

PCT Pub. Date: Jul. 3, 2003

(65) Prior Publication Data

US 2005/0017804 A1  Jan. 27, 2005

(30) Foreign Application Priority Data

Dec. 11, 2001 (AT) .............................. A 1935/2001

(51) Int. Cl.
*H03F 3/217* (2006.01)
(52) U.S. Cl. .................................. 330/251; 330/207 A
(58) Field of Classification Search ................. 330/251, 330/207 A, 10
See application file for complete search history.

(56) References Cited

U.S. PATENT DOCUMENTS

| | | |
|---|---|---|
| 4,458,362 A | 7/1984 | Berkovitz et al. |
| 4,610,024 A | 9/1986 | Schulhof |
| 4,688,258 A | 8/1987 | Kunugi et al. |
| 4,773,096 A | 9/1988 | Kirn |
| 5,481,615 A | 1/1996 | Eatwell et al. |
| 5,559,467 A | 9/1996 | Smedley |

(Continued)

FOREIGN PATENT DOCUMENTS

| | | |
|---|---|---|
| EP | 1104094 | 5/2001 |
| WO | WO 98 19391 | 5/1998 |

OTHER PUBLICATIONS

Hancock, J., "A Class D Amplifier Using Mosfets with Reduced Minority Carrier Lifetime", Journal of the Audio Engineering Society, Audio Engineering Society. NY, US, vol. 39, Nr. 9, pp. 650-662 XP000226144.

(Continued)

*Primary Examiner*—Henry Choe
(74) *Attorney, Agent, or Firm*—Collard & Roe, P.C.

(57) ABSTRACT

Method for generating an amplified high-power alternating voltage that follows a digital input data stream in terms of shape and amplitude, preferably in the known I2S format, whereby a direct-voltage supply that takes an essentially sine-shaped current is provided as the power supply. In order to achieve a high degree of effectiveness and a high level of congruency between the input data stream and the output signal, it is provided that the input data stream is converted into a digital signal sequence, and this signal sequence is amplified by switching, whereby a digital signal is derived from the amplified output signal, and compared with a digital signal that corresponds to the input data stream, and the amplification of the input data stream is influenced, in the sense of a congruency of the amplified signal with the input data stream, by means of switching by a digital difference signal that might be determined, whereby a signal that corresponds to the ripple of the direct-voltage supply is mixed into the input data stream or a signal derived from it.

10 Claims, 14 Drawing Sheets

U.S. PATENT DOCUMENTS

| | | | |
|---|---|---|---|
| 6,016,075 A * | 1/2000 | Hamo | 330/10 |
| 6,107,876 A | 8/2000 | O'Brien | |
| 6,150,969 A | 11/2000 | Melanson | |
| 6,549,069 B1 * | 4/2003 | Delano | 330/251 |
| 6,577,186 B1 * | 6/2003 | Berkhout | 330/10 |
| 6,897,725 B1 * | 5/2005 | Honda | 330/207 A |

OTHER PUBLICATIONS

Qiao, C., et al., "A Topology Survey of Single-Stage Power Factor Corrector with a Boost Type Input-Current-Shaper", APEC 2000. 15th. Annual IEEE Applied Power Electronics Conference and Exposition. New Orleans, LA, Feb. 6-10, 2000, Annual Applied Power Electronics Conference, New York, NY: IEEE, vol. 1 of 2, Conf. 15; pp. 460-467 XP001036175 ISBN: 0-7803-5865-1.

S. Logan, M.O.J. Hawksford, "Linearization of Class D Output Stages for High-Performance audio Power Amplifiers". Jul. 8, 1994, IEE, 'Advanced A-D and D-A Conversion Techniques and Their Applications', 1994 Conference, Publication No. XP002232332.

Nielsen, K., "PEDEC-A Novel Pulse Referenced Control Method for High Quality Digital PWM Switching Power Amplification", Power Elec. Specialists Conf., 1998. PESC 98 Record. 29th Annual IEEE Fukuoka, Japan May 17-22, 1998, NY, NY, USA, IEEE, US, pp. 200-207 XP010294870, ISBN: 0-7803-4489-8.

Klugbauer-Heilmeier, J., "A Sigma Delta Modulated Switching Power Amp", Journal of the Audio Eng. Society, Audio Eng. Society, NY, us, Nr. 3227, pp. 1-18 XP001055539, ISSN: 0004-7554.

Watanabe, S. et al., "Digitally Controlled Optimum Current Tracking Scheme of Two-Paralleled High-Power PWM Amplifier for Magntic Resonance Imaging", Power Elec. Specialists Conf., 1997. PESC '97 Record., 28th Annual IEEE St. Louis, MO, USA Jun. 22-27, 1997, NY, NY, USA, IEEE, US, pp. 686-691 XP010241617, ISBN: 0-7803-3840-5.

Watanabe, S. et al., "Analysis on a PWM Power Conversion Amplifier with IGBT Macro Model to Generate Gradient Magnetic Fields in MRI Systems", Power Elec. and Drive Systems, 1999. PEDS '99. Proceedings of the IEEE 1999 Int'l Conf. on Hong Kong Jul. 27-29, 1999, Piscataway, NJ, USA, IEEE, US, pp. 127-132, XP010352078, ISBN: 0-7803-5769-8.

Takano, H. et al., "Multiple-Bridge PWM Current-Regulated Power Amplifier for Magnetic Resonance Imaging System and its Feasible Digital Control Implementation", Industrial Elec. Society, 1999. IECON '99 Proceedings. The 25th Annual Conf. of the IEEE San Jose, CA, USA, 29 Nov. 3 Dec. 1999, Piscataway, NJ, USA, IEEE, US pp. 785-790 XP010366646 ISBN: 0-7803-5735-3.

International Search Report.

* cited by examiner

METHOD FOR GENERATING A HIGH-POWER ALTERNATING VOLTAGE THAT FOLLOWS AN INPUT DATA SYSTEM

CROSS REFERENCE TO RELATED APPLICATIONS

Applicants claim priority under 35 U.S.C. §119 of AUSTRIAN Application No. AT 1935/2001 filed on Dec. 11, 2001. Applicants also claim priority under 35 U.S.C. §365 of PCT/AT02/00338 filed on Dec. 5, 2002. The international application under PCT article 21 (2) was not published in English.

FIELD OF THE INVENTION

The invention relates to a method for generating a high-power voltage that follows an input data stream, e.g. in the Sony Consumer Standard $i^2s$ format, pursuant to the preamble of claim 1, as well as to a device for implementing the method.

BACKGROUND ART

In the consumer audio sector, for example, the power for the loudspeakers is transmitted by way of correspondingly voluminous copper wires. In addition to high costs, these cables also act as transmitting antennas of high-frequency interference, if switching amplifiers, so-called D amplifiers, are used. Within a greater progressive concept, a D amplifier that has a digital data stream supplied to it via light guides is built into the housing of the loudspeaker. The D amplifier of such a loudspeaker is supplied by means of a power network connector, and must also fulfill strict standards with regard to electromagnetic system perturbation by the environment.

In the case of such known solutions, conversion of the input data stream into an analog signal is always provided, which signal is then amplified and the amplified signal in turn is subsequently converted back to a digital signal. In this connection, however, a quality loss due to the repeated conversion cannot be avoided.

In addition, the degree of effectiveness of non-switching analog amplifiers, at approximately 50%, is relatively low Currently, switching amplifiers, i.e. those that contain power electronics, already reach degrees of over 90%. In the case of the D amplifier, the analog voltage applied to the input is pulse-width modulated (PWM) at a fixed frequency, the switching frequency of the D amplifier. This PWM voltage is amplified in the PWM end stage of the D amplifier by means of alternately switching transistors having a high degree of effectiveness on and off. The filter size of a D amplifier is determined by the lower auditory threshold (15 Hz). The degree of effectiveness is significantly influenced by the switching frequency. The switching frequency must amount to a multiple of the upper auditory threshold (20 Hz).

The spectrum of the amplified PWM voltage naturally has a great switching-frequency component and great harmonic components, which now have to be completely filtered out of the voltage again, accordingly, in order to obtain a high-power analog voltage that is as undistorted as possible at the load. In this connection, it is necessary to avoid pulse inaccuracies by means of corresponding feedback.

D amplifiers having an analog input and passive filters are known from the state of the art. The phase rotation of a band-pass filter and the complex loudspeaker load very quickly set narrow limits for the strong negative feedback that is desirable for low distortions, because of instabilities.

Another problem in known D amplifiers of this type also consists in the fact that direct voltage power supplies that essentially derive a sine-shaped current from a network, so-called power factor correction circuits (abbreviated as PFC hereinafter) deliver wave-shaped direct voltage that has a significant ripple component, i.e. ripple. In this connection, the ripple has a frequency that corresponds to 2n times the frequency of the network, whereby n stands for the number of phases of the network connected to a full-path rectifier circuit. However, a noticeable ripple of the voltage supply makes extensively distortion-free amplification of the input signal difficult. In order to smooth out ripple, DSDC stages are usual, but they require a relatively great effort/expenditure of switching technology.

U.S. Pat. No. 5,559,467 discloses an amplifier circuit using a D amplifier, the analog output signal of which is fed back to a "Noise and Ripple Shaping Chip." This "Noise and Ripple Shaping Chip" furthermore has a digital input signal and an analog signal from the voltage supply supplied to it.

An overview of PFC ("power factor corrected") rectifiers is offered by the article "A Topology Survey of Single-Stage Power Factor Corrector with a Boost Type Input-Current-Shaper," Qiao, C. et al., APEC 2000, $15^{th}$ Annual IEEE Applied Power Electronics Conference and Exposition, New Orleans, LA, Feb. 6–10, 2000, Annual Applied Power Electronics Conference, New York, N.Y.: IEEE, US, Vol. 1 of 2, Conf. 15, Page 460–467, XP001036175, ISBN: 0 7803 5865 1.

Another overview of PFC power supplies, also in connection with D amplifiers, is offered by the article "A Class D Amplifier Using MOSFETs with Reduced Minority Carrier Lifetime," J. Hancock, *Journal of the Audio Engineering Society*, Audio Engineering Society, New York, US, Vol. 39, No. 9, Page 650–662, XP000226144, ISSN: 0004–7554.

In U.S. Pat. No. 6,107,876, an amplifier circuit for a digital input signal is described, in which an analog signal is fed back.

SUMMARY OF THE INVENTION

It is the aim of the invention to propose a method of the type mentioned initially, which makes amplification possible in the case of a sine-shaped power consumption of the direct-voltage supply from the network, at a high degree of effectiveness, whereby the amplified voltage corresponds very precisely to the input data stream.

According to the invention, this is achieved, in the case of a method of the type stated initially, by means of the characterizing features of claim 1.

By means of the proposed measures, conversion to an analog signal is avoided and, at the same time, it is assured that even in the case of sine-shaped current consumption of the direct-voltage supply, i.e. in the case of significant ripple of the direct voltage applied to the D amplifier, the amplified signal corresponds to the input data stream to the greatest possible extent.

The derivation of the amplified output signal can take place according to any desired algorithm. For example, the derivation of a digital signal from the amplified output signal can take place according to the algorithm of an adaptive delta modulation, whereby a superimposed algorithm for reducing the effective switching frequency can also be provided, or according to an advanced pulse code modulation. In this connection, the algorithms indicated above merely represent examples.

It is another aim of the invention to propose a device for implementing the method according to the invention.

Proceeding from a device according to the preamble of claim 2, the characterizing features of claim 2 are therefore proposed.

As a result of the proposed measures, a very simple structure results, whereby a very precise balancing of the amplified voltage with the input data stream is assured by means of the digital loop. In this connection, variations in the direct-voltage supply of the D amplifier are also recognized and taken into consideration.

Without the admixing of the signal that corresponds to the ripple of the direct-voltage supply to the input signal or a signal derived from it, the regulator would only notice variations in the direct-voltage supply after the pass-through time of the signals through the device, whereby filters are also provided, if necessary. Within the pass-through time, all changes in the supply voltage would therefore be passed on to the load directly, as amplitude modulation. By means of the proposed measure, it is assured that changes in the supply voltage of the amplifier stage are counteracted. In this way, the effort/expenditure in terms of switching technology for the voltage supply is kept low even if the latter consumes an essentially sine-shaped current and therefore causes only a slight network feedback. Therefore, the desired results can be achieved using simple PFC circuits.

By means of the characteristics of claim 3, the advantage is obtained that an adaptation to the conditions resulting from the region that follows the actuator is also possible. This is advantageous, for example, in the case of audio systems. Thus it is possible, in the case of an audio system for a disco, to equalize changes in attenuation that occur with an increasing number of guests, and therefore changes in the signal segment that follows the actuator, for example a loudspeaker.

By means of the proposed measures, the regulator can also be used to detect and regulate out variations in the supply voltage of the power part. In addition, the voltage source can be structured in simpler manner, and be implemented, for example, merely by means of a simple PFC that follows a rectifier circuit. The computing capacity for the comparator and regulator can be implemented in a microprocessor, in rather slow manner, or quickly in a circuit-programmable IC in a hard-wired computing circuit. At the high conversion speeds of today's A/D converters (e.g. 90 MHz), a sufficiently small loop pass-through time can already be implemented now, in the latter case, so that then a pulse pattern correction also takes place using this regulator structure.

By means of the characteristics of claim 4, it is possible to generate a pulse pattern, whereby the digital input data stream is processed to produce a high-power PWM output voltage with high congruency, and quality-reducing digital/analog conversion can be eliminated.

By means of the characteristics of claim 5, the requirements regarding the power supply decrease, with little digital switching effort/expense.

If filter distortions are also supposed to be regulated out, the problem of the phase rotation must be solved. This is done in the loop according to claim 6.

The phase rotation can be compensated by means of a timing element that can be implemented very easily in digital technology. In this connection, the reference value is reported to the regulator, delayed by the filter running time, so that it arrives at the same time with the feedback digitalized output voltage. As a result, the regulator functions in stable manner.

By means of the characteristics of claim 6, it is possible to generate a pulse pattern, whereby the digital input data stream is processed to produce a high-power PWM output voltage with high congruency, and quality-reducing digital/analog conversion can be eliminated.

For high quality demands, a high-quality energy supply and a correspondingly complicated D/A converter (filter) are necessary.

However, the regulator notices variations in the supply voltage only after the pass-through time of the D/A converter or filter. Within the pass-through time, any changes in the supply voltage are passed on to the load directly, as amplitude modulation, and this is expressed in the form of an insufficient supply voltage rejection (SVR).

Combinations of several loops according to claims 7 to 9 appear to be advantageous.

Thus, the characteristics of claim 7 result in savings in the power supply, and the characteristics of claim 8 result in savings in connection with the D/A converter.

It is particularly advantageous to provide the characteristics of claim 9, from which savings in the power supply and the D/A converter result.

Acceptable results are currently achieved with a negative feedback network to equalize the switching time errors, and complex, tolerance-sensitive and necessarily multi-stage filters and a correspondingly high switching frequency. The fast internal loop for pulse pattern correction of the amplifier stage has required an analog signal until now, i.e. the D/A conversion of a digital input data stream. The required switching frequency of far more than 100 kHz and the related fast commuting processes in the amplifier stage make it difficult to adhere to the standards that are binding on all products brought into commerce in the EU territory since Jan. 2, 1996, particularly EN 50081 with regard to the interference emission of electromagnetic fields.

By means of the characteristics of claim 10, the D amplifier can be operated with at least the same quality of the output signal as compared with the single-stage solution, e.g. on the basis of the phase-offset cycling of n power parts 5 switched in parallel, at one $n^{th}$ of the switching frequency. The switching processes can take place more slowly, without losses in quality. This increases the electromagnetic compatibility. The switching losses increase, the degree of effectiveness remains high as compared with the A amplifier. In the case of higher power values (currently about 5 kW and up), relief circuits can also be used on the basis of the reduced switching frequency, whereby the power density (power that can be transmitted per volume of the power parts) is increased.

In addition, the advantages that result from switching together several D amplifier stages can be utilized, without increasing the computing output of the digital control unit by a corresponding multiple. In this connection, the amplifier stages can have a relatively simple structure.

BRIEF DESCRIPTION OF THE DRAWINGS

The invention will now be explained in greater detail, using the drawing. In this connection, the figures show.

In all the figures, digital data streams are shown with crosshatched bars, and analog data streams are shown with simple lines.

BRIEF DESCRIPTION OF THE PREFERRED EMBODIMENTS

Figure 1:
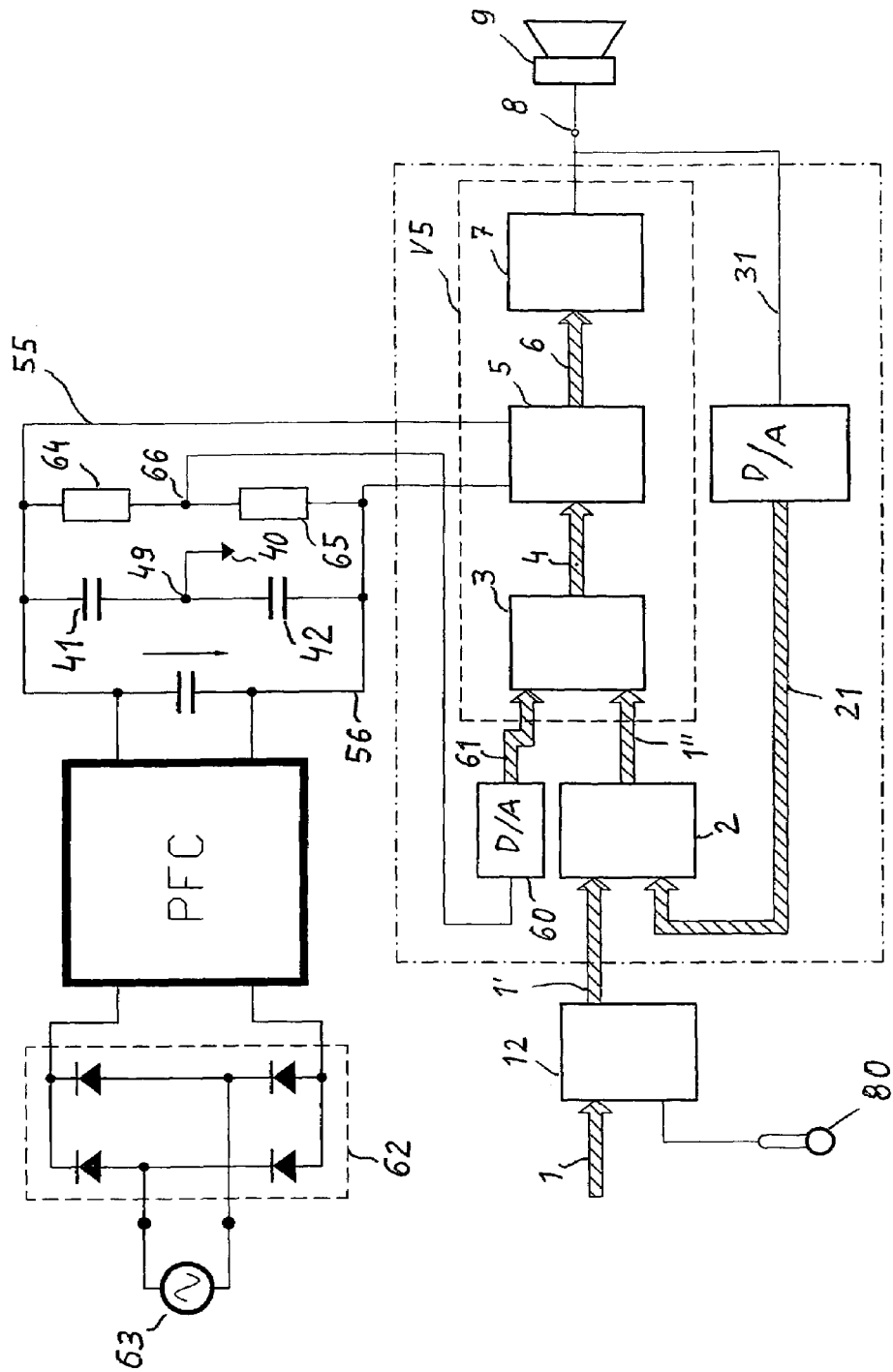
FIG. 1 a first exemplary embodiment of an amplifier arrangement.
Figure 8:
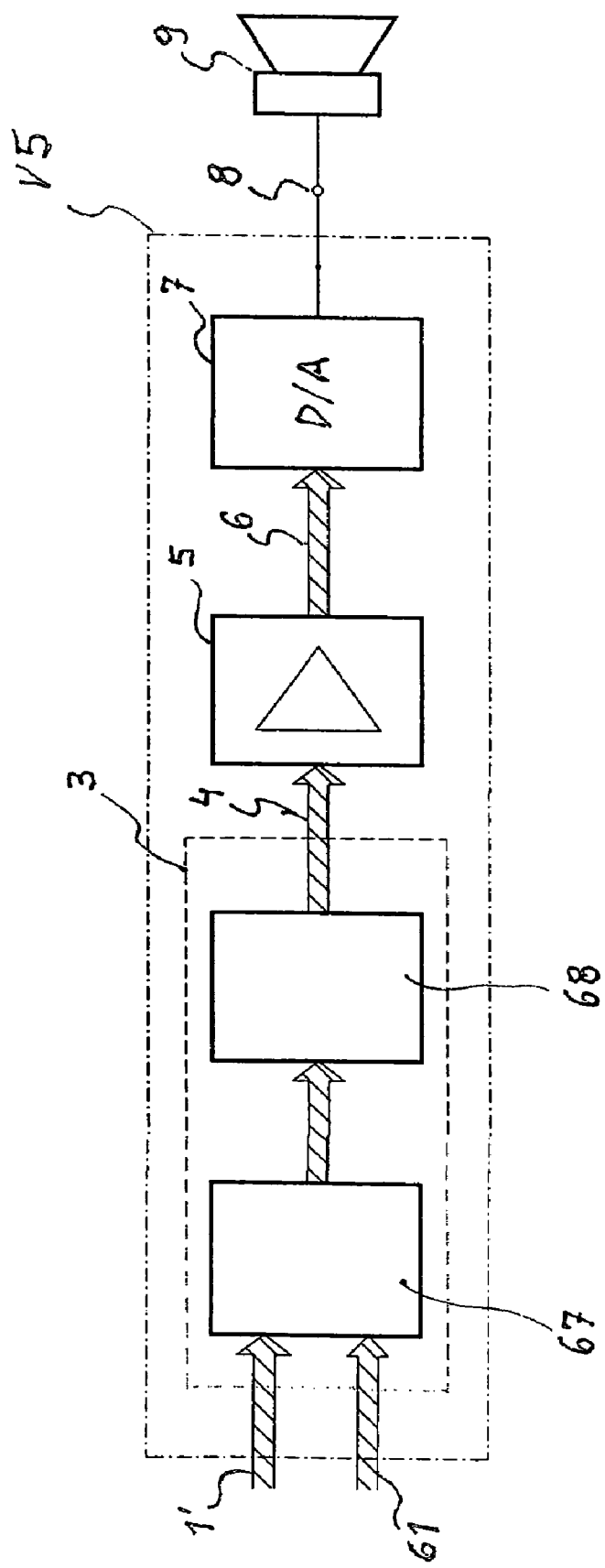
FIG. 8 an amplifier stage (V5) according to a fourth embodiment, without loops (R1, R2, R3)

The amplifier arrangement or device according to FIG. 1 has an amplifier stage V5 that is shown in greater detail in FIG. 8, and a loop 2 or a predictor 2' that precedes the amplifier stage V5, to which an actuator 9, e.g. a loudspeaker, is connected by way of an output terminal 8.

The amplifier stage V5 essentially has a serial circuit 3 of a mixer 67, which generates a data stream 1" from an input data stream 1' that comes from the loop 2 or the predictor 12, whereby the predictor 12 can also be switched ahead of the loop 2, and a data stream 61 which, as will be explained below, corresponds to the ripple of a direct-voltage supply of a D amplifier 5, and of a coder 68, which converts the data stream 1" into a digital signal sequence 4. This function block, consisting of the mixer 67 and the coder, will be referred to as the mixer/coder circuit 3 hereinafter. This circuit 3 is followed by a D amplifier 5, which amplifies the digital signal sequence and applies it to a D/A converter 7, which can also be configured as a filter circuit.

The loop 2 is connected with the output terminal 8 by way of an A/D converter 20 and a line 31. The predictor 12 that precedes the loop 2 is not necessarily required, whereby an input of the predictor 12 has a signal applied to it that comes from a microphone 80. In this way, changes in a signal segment that follows an actuator that is connected with the device, for example a loudspeaker 9, e.g. in a space to which the loudspeaker provides sound, for example a disco, can be detected, caused, for example, by a change in the number of persons located in this space. A greater change in the number of persons located in the space to which the sound is provided changes the attenuation and thereby the characteristics of the signal segment that follows the loudspeaker.

For example, a signal can be supplied to the loop from a loudspeaker that serves as an actuator 9, set up in a disco, i.e. from the disco itself. In this case, not only can distortions that might be caused by the amplifier stage V5 be regulated out, but also distortions and influences that are caused by the subsequent segment, such as the attenuation that is dependent on the number of persons located in the space, can also be regulated out.

In this embodiment, the loop 2 and the predictor 12 precede the amplifier stage V5, so that a data stream 1", which is applied to the loop 2, i.e. the predictor 12, in the form of data words having a predetermined number of bits, which is changed as compared with the data stream 1, 1' is applied to the amplifier stage V5.

A predictor 12 requires feedback at most part of the time, so that the connection between the microphone 80 and the corresponding input of the predictor 12 can also be interrupted, part of the time, by means of a switch, not shown. The predictor 12 images the inverse function of the system behavior, for example mathematically. It can also consist of a so-called neuronal network, which has learning capacity, or also consist of a cell capable of learning. Principles and theory of neuronal networks, as well as their structure, are known from the relevant literature and do not represent part of the invention.

The advantage of a predictor 12 consists in its robustness in resisting interference, since it makes do without constant feedback, and in the expanded possibilities that result in the case of a neuronal network that can learn, in particular.

However, a predictor cannot compensate the noise of a system that changes over time, such as thermal drift, switching time jitter, etc. The transmission behavior of an open-loop control system that does not change over time is implemented by means of feedback, at least part of the time.

Figure 5:
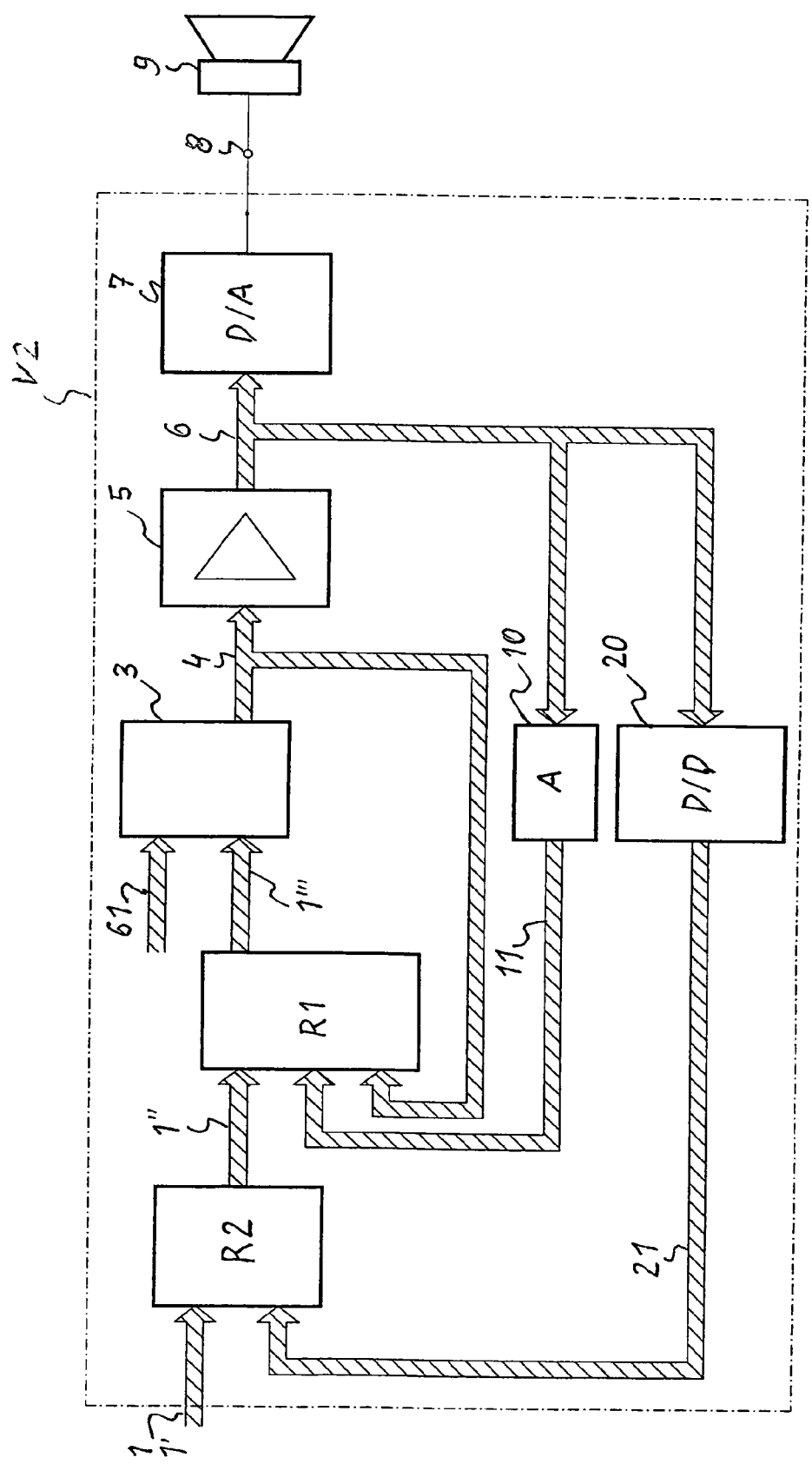
FIG. 5 an amplifier stage (V2) according to a first embodiment, using two loops (R1, R2)

For this purpose, the loop 2 constantly needs the feedback of the signal tapped at point 4' or of a signal 11 that is tapped at point 6', amplified, and attenuated by way of the attenuator 10 (FIG. 5).

Figure 2:
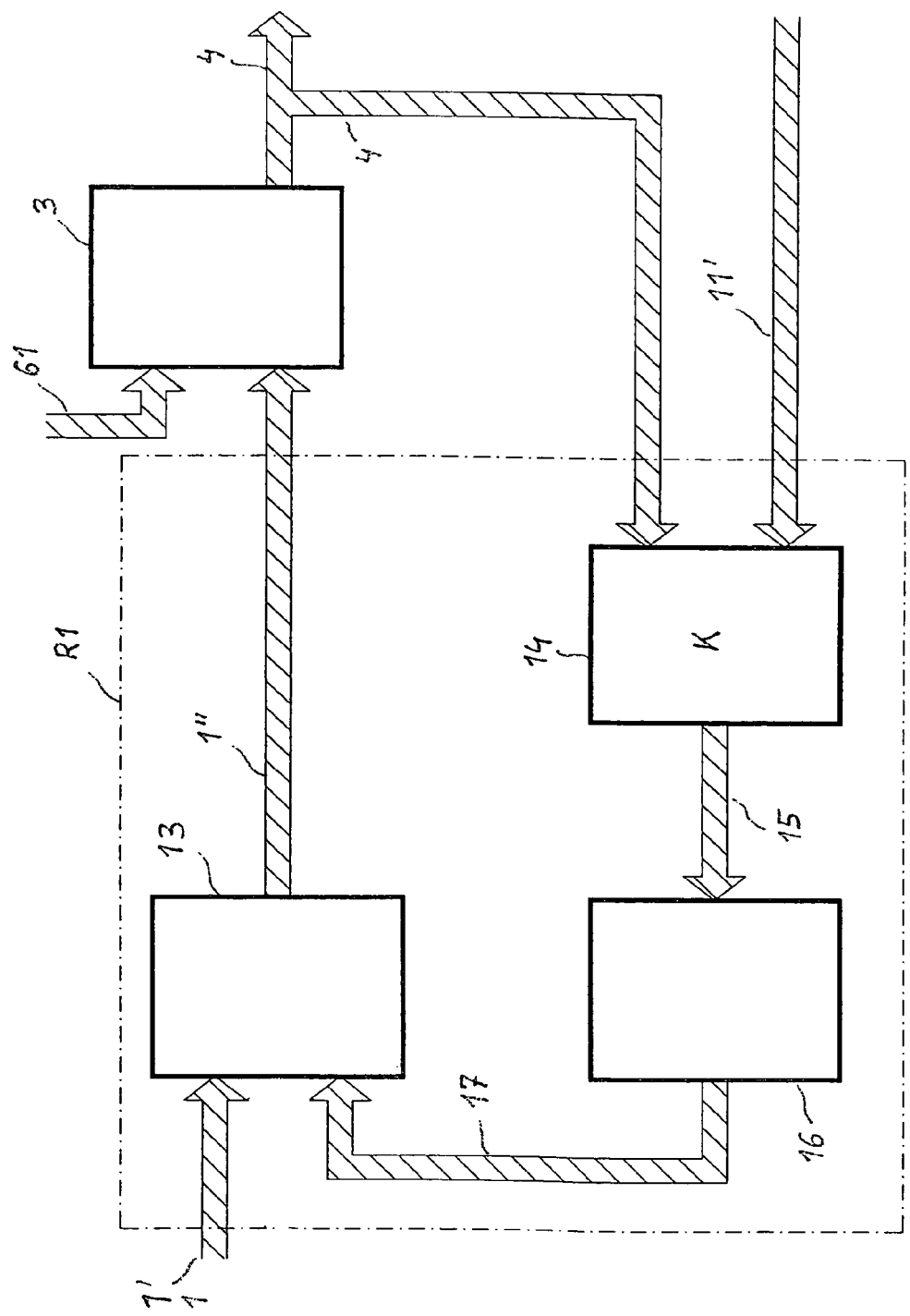
FIG. 2 a loop (R1) according to a first exemplary embodiment.
Figure 3:
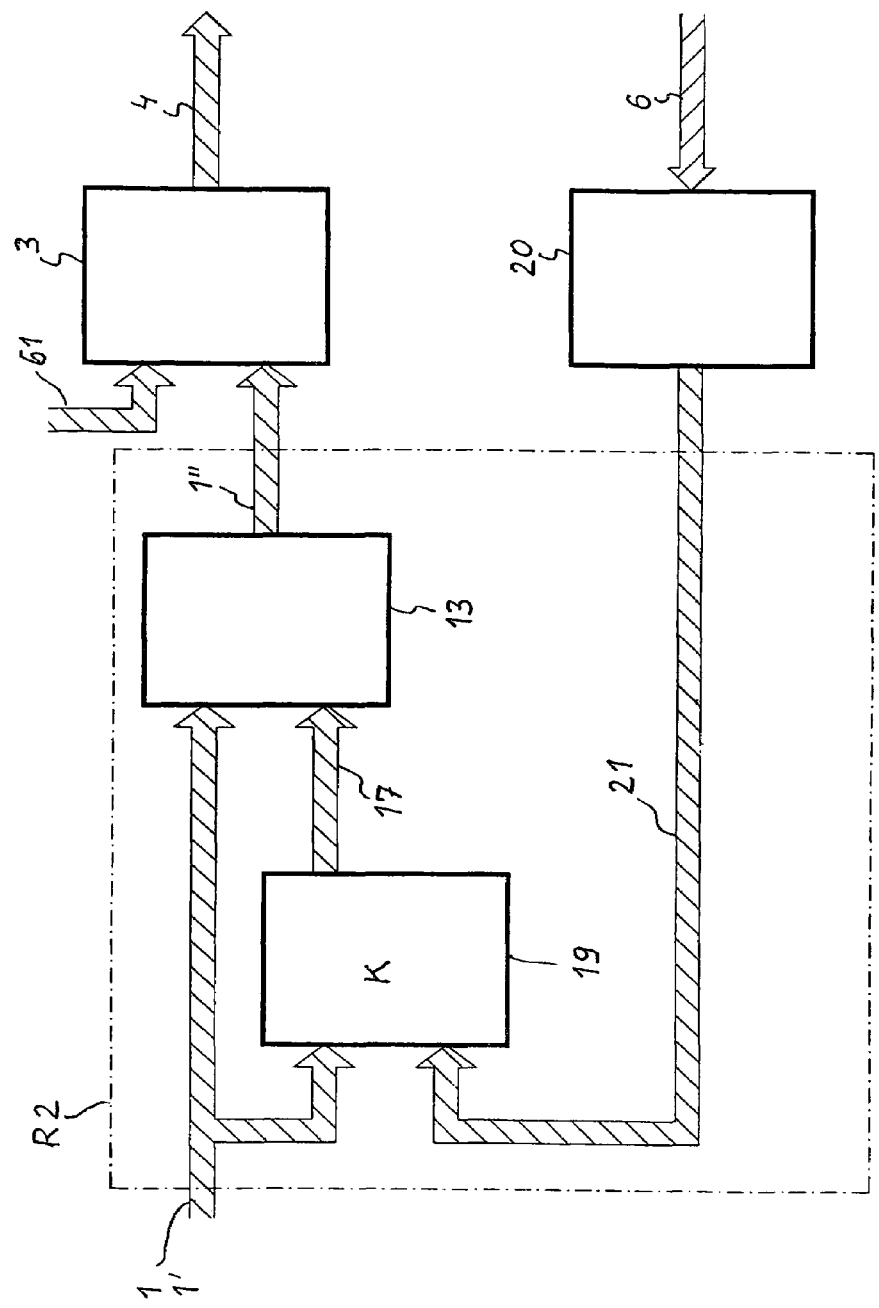
FIG. 3 a loop (R2) according to a second exemplary embodiment.
Figure 4:
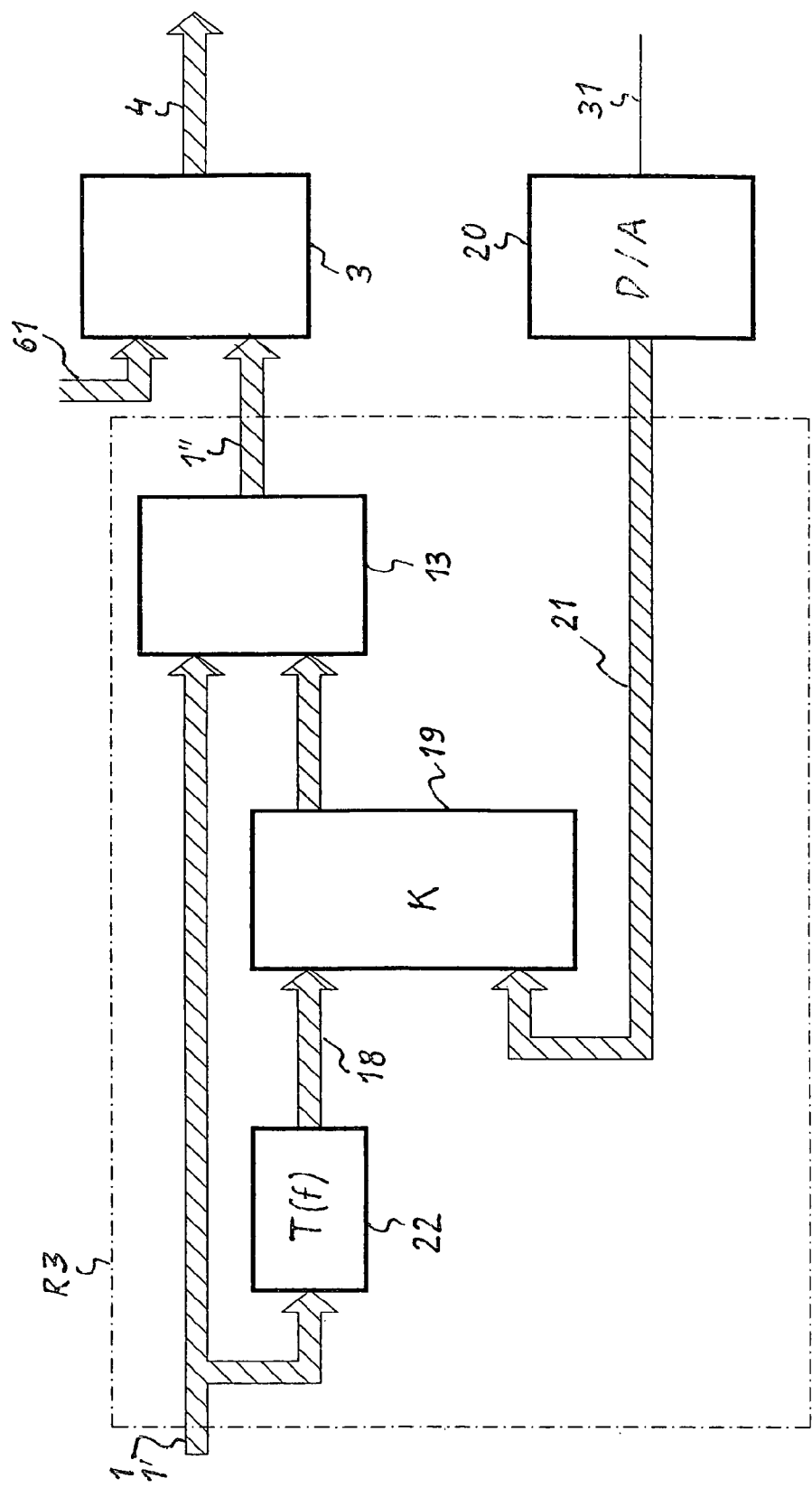
FIG. 4 a loop (R3) according to a third exemplary embodiment.

In the case of the circuit according to FIG. 1, the loop 2 can be structured in different ways, whereby different examples are shown in FIG. 2 to 4 and explained in chapters 1.1 to 1.3.

In the case of the embodiment according to FIG. 1, a full-path rectifier 62 connected with a network 63 is provided to supply power to the D amplifier 5, which rectifier derives an essentially sine-shaped current from the network 63. This rectifier 62 is followed by a power factor correction circuit PFC that supplies the supply lines 55, 56 of the D amplifier 5.

Capacitors 41, 42 are connected with these two supply lines 55, 56, both of which are connected to the ground 40. Furthermore, a voltage splitter 64, 65 is connected with the supply lines 55, 56, the center tap 66 of which is connected with an A/D converter 60 by means of a line 59, the data stream 61 of which is passed to the mixer 67 of the mixer/coder circuit 3.

Variations in the direct voltage that supplies the D amplifier 5 enter into the control of the D amplifier 5 by way of the A/D converter 60 and the mixer 67. In this way, it is avoided that the variations of the supply voltage result in an amplitude modulation of the amplified signal.

1.1 First Example for Loop 2 (R1)

FIG. 2 shows the fundamental structure of a first embodiment R1 of a loop 2. In this embodiment, a regulator 13, a coding device 16, and a pulse error comparator 14 are provided. In this connection, the input data stream 1 or the input data stream 1' of a predictor 12 are applied to the inputs of the regulator 13, as is the output signal 17 of the coder 16. The latter converts the digital signal sequence 15 that comes from the comparator 14 into an error data stream 17, which influences the regulator 13.

In this connection, an output signal of the mixer/coder circuit 3 and a signal 11 from the attenuator 10 (not shown in FIG. 2) is passed to the comparator 14, whereby the attenuator 10 is preferably connected with the point 6' of the amplifier stage. The comparator 14 can preferably be an XOR link. The coding device 16 can be a time-limited up/down counter.

The regulator 13 generates an output data stream 1" from the input data stream 1 or the data stream 1' and the error data stream 17. The data streams 1" and 61, the latter of which corresponds to the variations in the direct voltage supply of the D amplifier 5, are processed by the mixer/coder circuit 3 of the amplifier stage to produce a digital data sequence 4. In this connection, the regulator 13 can also comprise the mixer 67, whereby then the circuit 3 merely comprises a coder 68.

Figure 13:
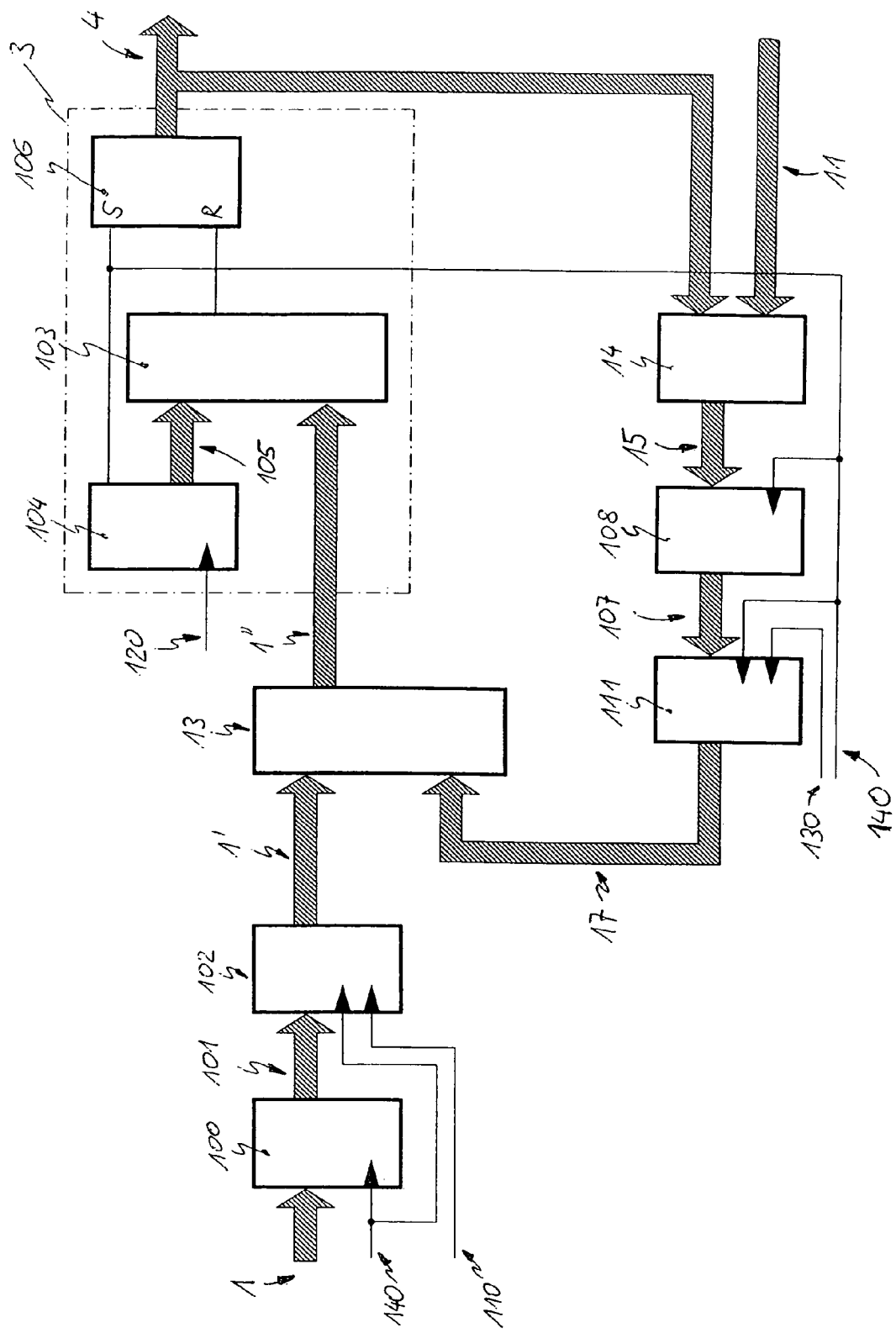
FIG. 13 schematically, a regulator.

At the high conversion speeds of today's A/D converters, of 90 MHz, for example, the loop pass-through time of the regulator R1 is sufficiently short so that a pulse pattern correction can be made, in order to increase the quality. Changes in the supply voltage of the D amplifier 5, i.e. changes in the intermediate circuit voltage, are compensated by means of the data stream 61 of the A/D converter 60. FIG. 13 shows the digital implementation of loop R1, as an example.

1.2 Second Example for Loop 2 (R2)

The loop R2 according to FIG. 3 has a comparator 19 and a regulator 13. The regulator 13 and the comparator 19 process the input data stream 1, 1' and the digital actual data stream 21, which is provided by the converter 20, which converts the digital signal sequence 6 into the data stream 21. In this connection, the comparator 19 generates an error data stream 17 that is passed to the regulator 13, which generates a data stream 1" that is processed in the subsequent amplifier stage, as was already explained in connection with FIG. 1.

Variations in the supply voltage of the D amplifier 5 can also be detected and regulated out using the loop R2. In this way, the voltage source of the D amplifier 5 can be structured in simple manner. The computing capacity for the comparator 19 and the regulator 13 can be implemented in a microprocessor, in rather slow manner, or quickly in a hard-wired computing circuit, for example a circuit-programmable IC, whereby a pulse pattern correction is also possible.

1.3 Third Example for Loop 2 (R3)

The loop R3 according to FIG. 4 differs from the loop R2 according to FIG. 3 in that the reference or input data stream 1, 1' is passed to the comparator 19, with a time delay relative to the regulator 13, by way of a timing element 22, and that the output voltage 31 of one or more amplifier stages is applied to the input of the converter 20, which converts analog signals into an actual data stream.

In the timing element 22, it is advantageous if a filter characteristic or the segment transmission behavior of the subsequent amplifier stage is compensated. On the basis of the comparison of the data stream 18 that the timing element 22 provides, and the data stream 21 that the converter 20 provides, which reach the inputs of the comparator 19 with the same time delay, relative to the input data stream 1, 1', the regulator 13 functions in stable manner. The regulation permits the use of simpler filters, e.g. D/A converters, at the output of the amplifier stage. The computing capacity for the regulator R3 is provided by a microprocessor.

Figure 6:
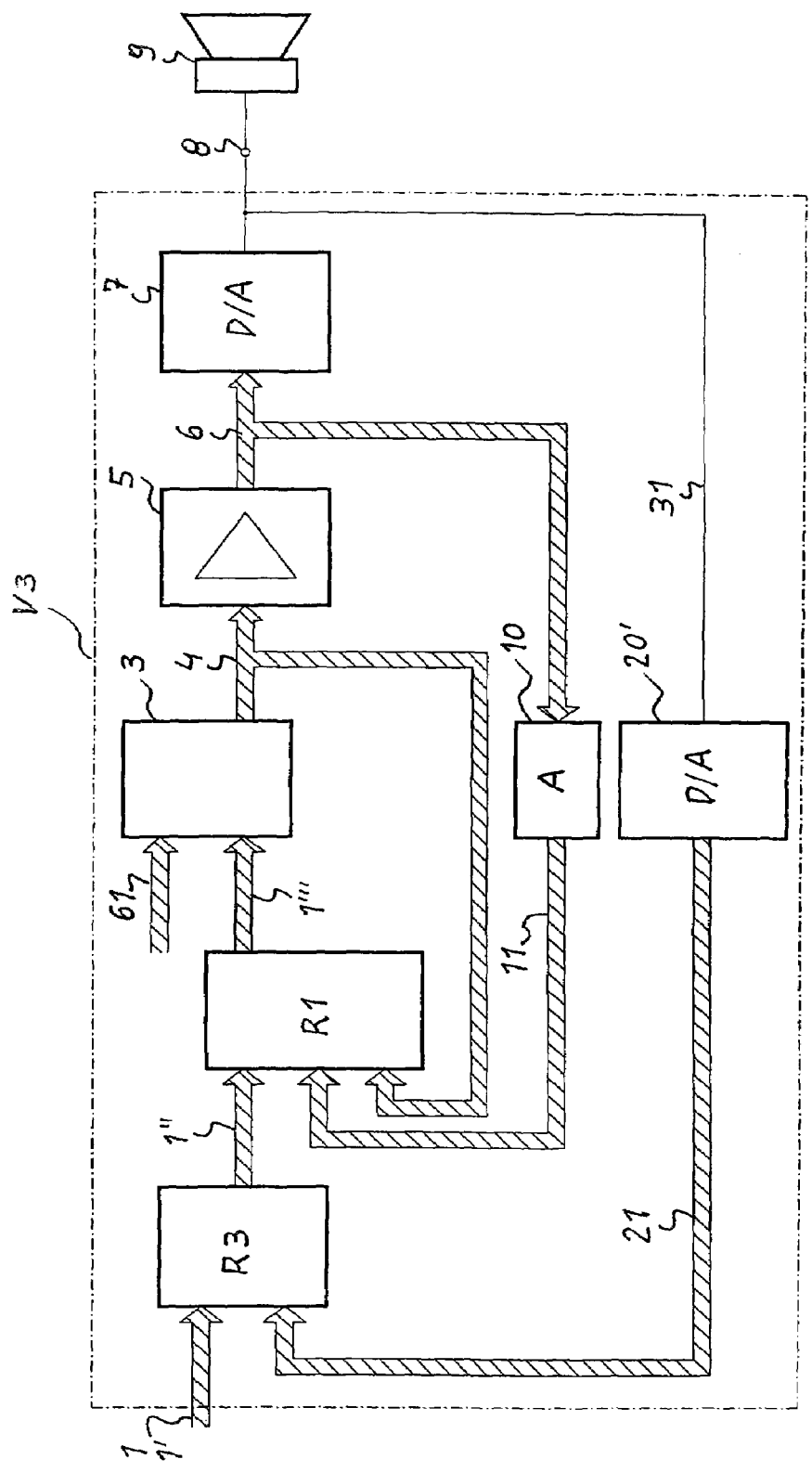
FIG. 6 an amplifier stage (V3) according to a second embodiment, using two loops (R1, R3)
Figure 7:
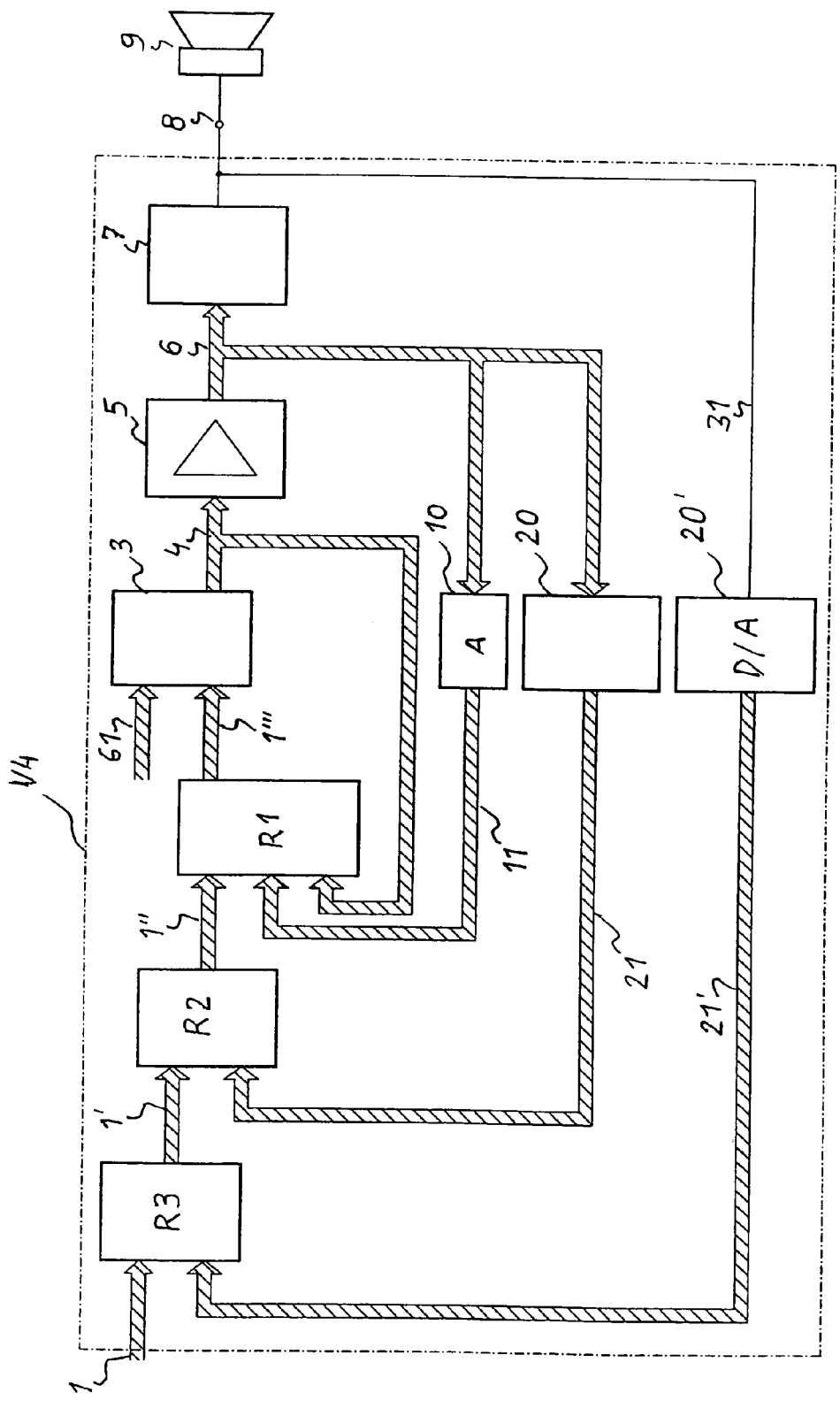
FIG. 7 an amplifier stage (V4) according to a third embodiment, using three loops (R1, R2, R3)
Figure 9:
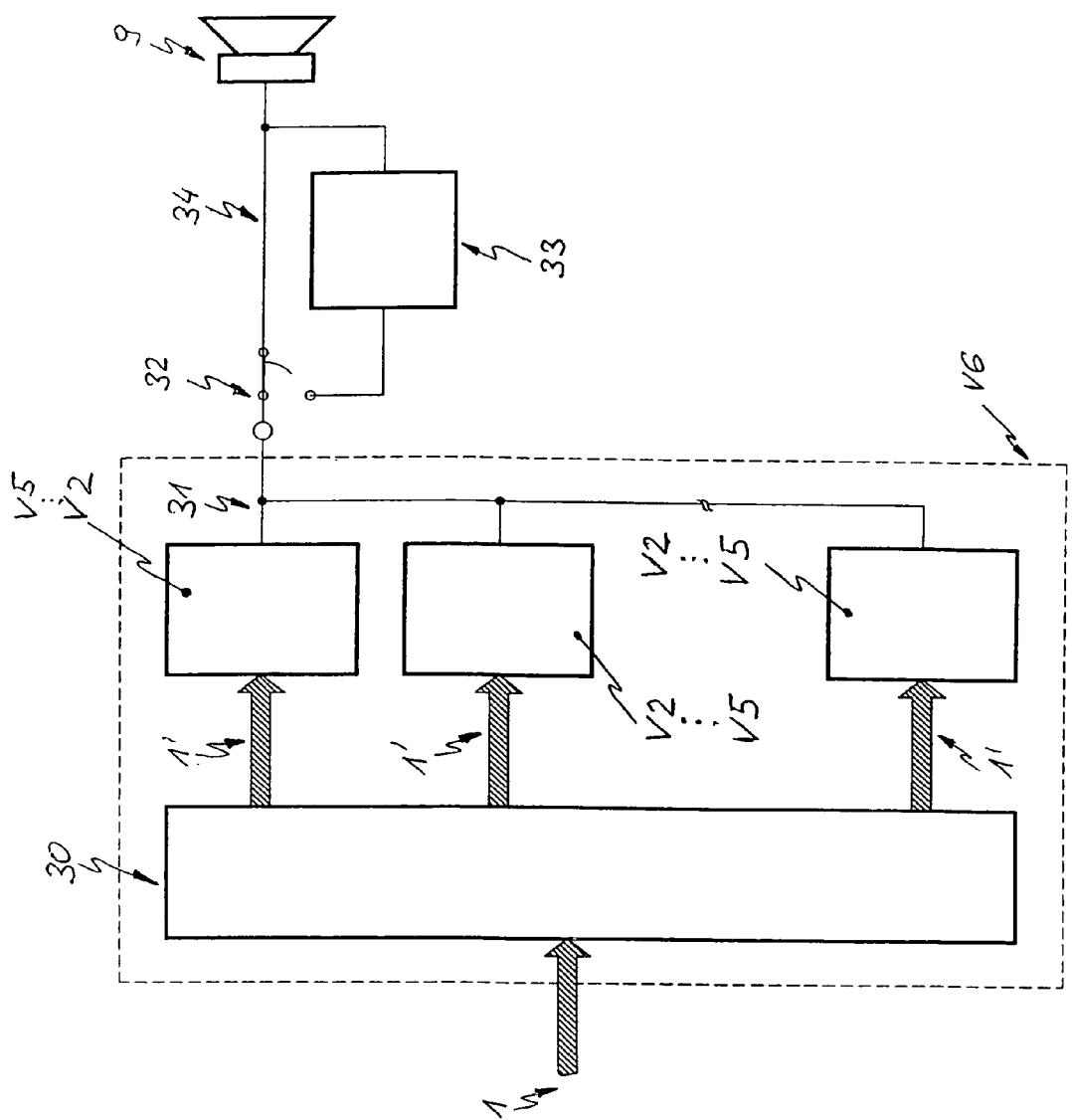
FIG. 9 an amplifier stage (V6) according to a fifth B embodiment, using amplifier stages (V2, V3, V4, V5) switched in parallel.

In the case of the different embodiments of the invention in the form of amplifier stages V2 to V4 according to FIG. 5 to 7, and V6 according to FIG. 9, the required effort/expenditure for the energy supply and amplification becomes less, at the expense of an increased effort/expenditure of low-power control electronics, which guarantee an increasingly better quality of the output voltage at the load, i.e. the actuator 9.

2.1 First Embodiment of Invention (V3)

The amplifier stage V3 according to FIG. 6 has a loop R3, a loop R1, the coding unit 3, a D amplifier 5, a D/A converter 7, an attenuator 10, and a converter 20. In this connection, the output voltage 6 is fed back to the inputs of the attenuator 10 and the converter 20. The signal 11 at the output of the attenuator 10 is fed back to the regulator R1. The converter 20 generates the data words of the actual data stream 21 from the voltage 6. The data stream 21 is passed to the loop R3. The loop R3 generates the data stream 1", which is passed to the loop R1, from the data streams 1 or 1' and 21. The data stream 1'" is generated from the data stream 1" and the signal 11 in the loop R1, and processed by the coding unit 3 to produce a digital signal sequence 4, which is applied to the output of the D amplifier 5, in amplified form, as a voltage 6.

The loop R3 can be designed to be slower than the loop R1 and makes it possible, for example, to regulate out variations in the supply voltages of the D amplifier 5 in FIG. 6.

2.2 Second Embodiment of Invention (V2)

The amplifier stage V2 according to FIG. 5 differs from the amplifier stage V3 according to FIG. 6 in that instead of the loop R3, a loop R2 is provided. The remainder of the structure of the amplifier stage V2 is the same as that of the amplifier stage V3.

Variations in the supply voltage of the D amplifier 5 can also be detected and regulated out by means of the loop R2. In this way, the voltage source of the D amplifier 5 can be structured in simple manner. The computing capacity for the comparator 19 and the regulator 13 can be implemented in a microprocessor, in rather slow manner, or quickly in a hard-wired computing circuit, in a circuit-programmable IC, whereby a pulse pattern correction is also possible.

2.3 Third Embodiment of Invention (V4)

The amplifier stage V4 in FIG. 7 differs from the amplifier stage V3 in that in addition, a loop R2 is provided, which is switched between the loops R3 and R1. In this connection, the output voltage of the amplifier stage V4 is fed back to the loop R3 by way of the A/D converter 20', which generates a data stream 21' from the output voltage 31.

The signal sequence 6 is fed back by way of the converter 20, which generates a data stream from the amplified signal sequence 6, which data stream is applied to the loop R2, which follows the loop R3, on the one hand. Furthermore, the signal sequence 6 is fed back to the loop R1, which follows the loop R2, by way of an attenuator 10 that generates a signal sequence 11.

The loop R3 regulates in accordance with the output voltage 31, and thereby reduces the demands on the converter 7. The timing element 22 of the loop R3 can be implemented in significantly simpler manner and with higher quality, using digital technology, by means of a shift register, than timing elements implemented in analog technology, which necessarily require multiple stages.

The functions and the structure of the individual loops R1, R2, R3 are the same as they were described in connection with FIG. 2 to 4.

In the arrangement of three loops R1, R2, R3, the hardware effort/expenditure can be kept low. In this connection, filter distortions can also be regulated out by means of feedback of the output voltage, whereby it might even be possible to eliminate a filter stage. In addition, the most various filter characteristics can be taken into consideration in a control device that functions digitally, without significant additional effort/expenditure.

3. Best Mode for Carrying Out the Invention (V6)

FIG. 9 shows an amplifier stage V6 that has a multiplexer 30 and a number n of amplifier stages, which can be structured in accordance with the amplifier stages V2 to V5. The multiplexer 30 generates a number of n-tiles of data streams 1' from the input data stream 1, whereby each data stream 1' is passed to one of the amplifier stages V2 to V4, whereby it is practical if equal amplifier stages are provided, in each instance. The outputs of the n amplifier stages are connected with the output terminal 8 and feed the supply voltage 31. The actuator 9, e.g. a loudspeaker, is either directly connected with the output terminal 8 of the amplifier stage V6 by way of a line 34, or indirectly by way of an intermediate filter 33.

In the case of the embodiment according to FIG. 9, the D amplifier can be operated with the $n^{th}$ part of the frequency, with at least the same quality of the output signal as compared with the single-stage solution, e.g. on the basis of the phase-offset cycling of n D amplifiers 5 switched in parallel. The switching processes can take place more slowly, without quality losses. In this way, the electromagnetic tolerance is increased. The switching losses increase, the degree of effectiveness remains high, compared with an A amplifier. At higher power values of 5 kW and more, for example, relief circuits can also be used, on the basis of the reduced switching frequency, whereby the power density, the power that can be transmitted per volume of the power parts, is increased.

Figure 10:
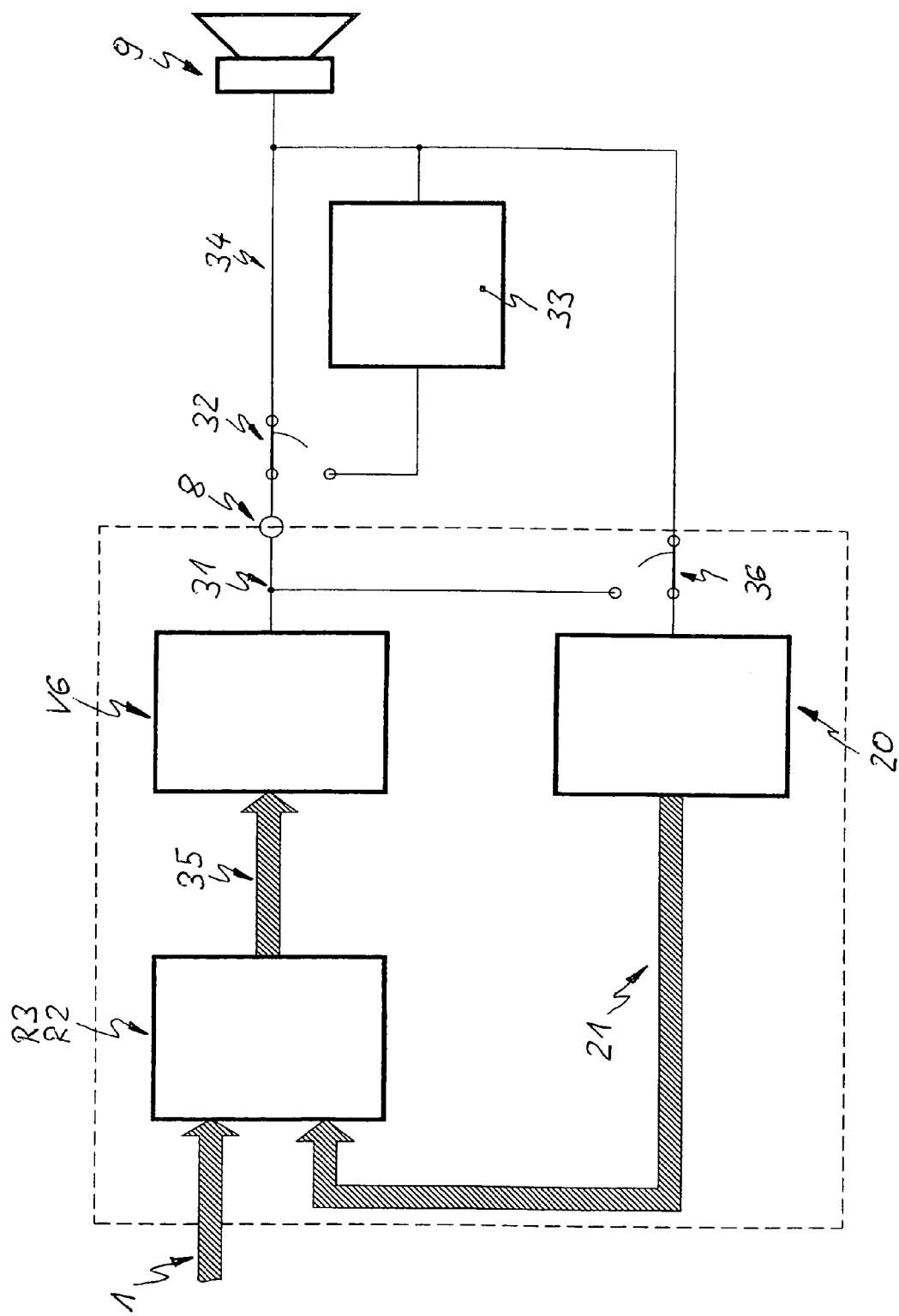
FIG. 10 an amplifier arrangement using an amplifier stage (V6) according to FIG. 9.

In the embodiment according to FIG. 10, a regulator R2 or R3 (FIG. 3, FIG. 4) precedes an amplifier stage V6 which, as is evident from FIG. 9, comprises several D amplifiers, which regulator processes the input data stream 1 and the output data stream 21 that is generated by the converter 20 to produce the data stream 35. The voltage at the output terminal 8 of the amplifier stage V6 or the voltage at the load 9 is fed back to the input of the converter 20 by means of a change-over switch 36, which can also be left out.

In the embodiment according to FIG. 10, the advantages that result from the use of several D amplifiers can be utilized without having to increase the computing capacity of the digital computing unit by a corresponding multiple. In this connection, the amplifier stage V6 can be composed of simple amplifier stages, e.g. amplifier stages V5 (FIG. 1).

In the embodiment according to FIG. 10, a change-over switch 32 is furthermore provided, by way of which the output terminal 8 can be optionally connected with the load 9 by way of a filter 33, or directly.

Figure 11:
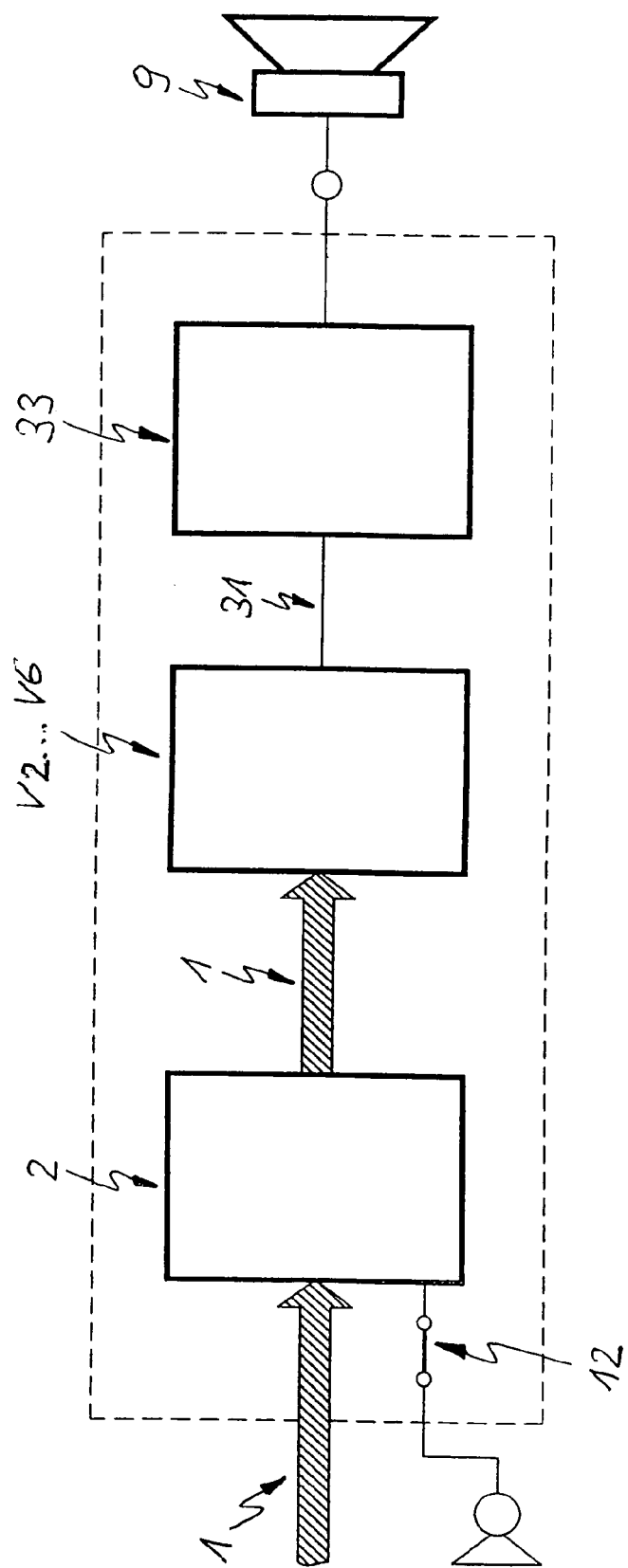
FIG. 11 an amplifier arrangement using the amplifier stages (V2, V3, V4, V5, V6) according to FIGS. 5 to 9.

In the embodiment according to FIG. 11, a predictor 12 precedes an amplifier stage, which can optionally be an amplifier stage V2, V3, V4, V5, or V6; at its input, signals of a microphone 80 can be applied, which is set up, for example, in a room in which the load 9, which can be a loudspeaker, provides audio. In this connection, a filter 33 follows the amplifier stage.

In this connection, the influence of that segment that follows the load 9 can also be detected. Since the predictor 12 takes into consideration the behavior of the open-loop control system that comprises the amplifier stage, constant feedback is not necessary.

Figure 12:
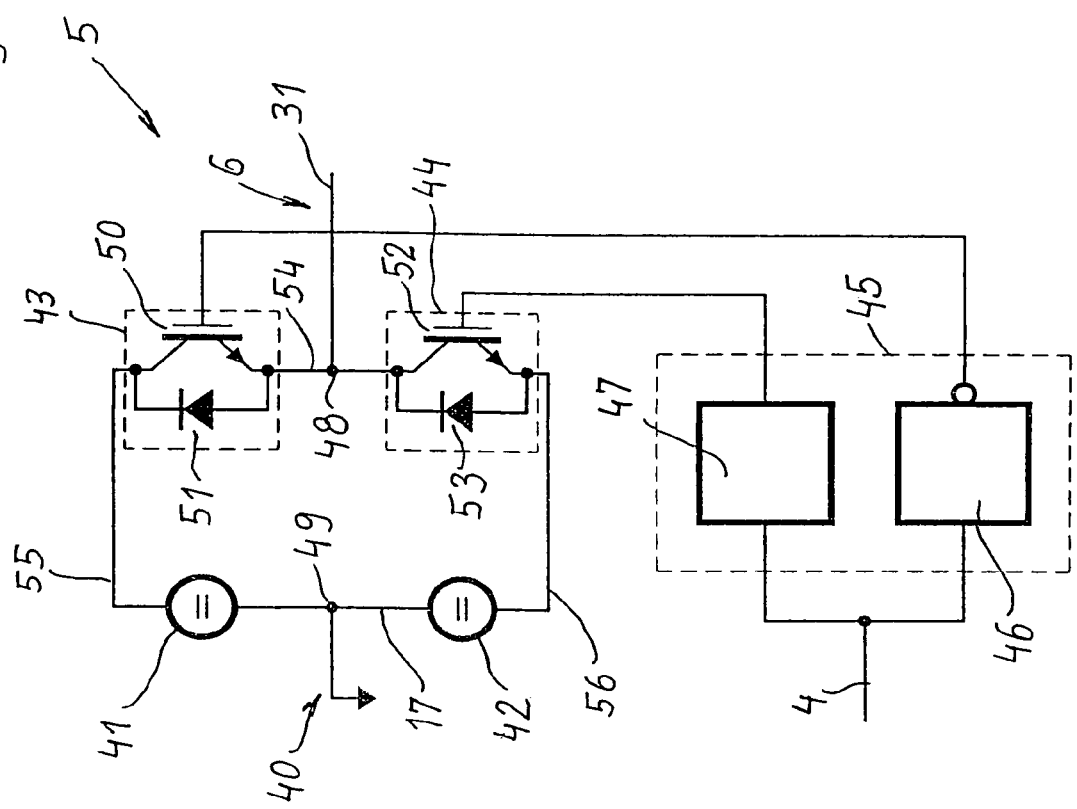
FIG. 12 an exemplary embodiment of a power part of a D amplifier stage.

FIG. 12 shows the exemplary embodiment for the power part 5. The power part 5 is formed, for example, from the voltage supplies 41, 42 and a half-bridge arrangement 43, 44. The half-bridge arrangement is formed from a main switch 50 and an anti-parallel free-wheeling diode 51 and another main switch 52 having another free-wheeling diode 53.

The output of the main switch 50 is connected with the input of the main switch 52 by way of a line 54. The input of the main switch 50 is connected with the voltage supply 41 by way of the supply line 55, and the output of the main switch 52 is connected with the voltage supply 42 by way of the supply line 56.

The voltage supply 42 is switched in series. The line 57 is connected with the power ground 40 at the node 49. Two supply devices 41, 42, switched in series, are loaded with the half-bridge arrangement of the power switches 43, 44. The signal 6 is applied at the center point 48 of the half-bridge arrangement. The reference potential for the high-power voltage 6 is the power ground 40, which is connected with the connecting point 49 of the supply devices 41, 42. The low-power signal sequence 4 is supplied to the driver device 45. If the signal 4 is high, the top switch 43 is turned on, by means of a non-inverting driver device 47, and the bottom switch 44 is turned off, by means of an inverting driver device 46.

The voltage 6 or 31 is equal to the output voltage of the supply device 41, relative to the ground 40. If the signal 4 is low, the point 48 is connected with the supply device 42, by way of the bottom switch 44. The voltage 6, 31 is equal to the negative output voltage of the supply device 42, relative to the power ground 40. The low-power signal sequence 4 is applied, in amplified form, to the half-bridge center point 48, at the levels of the supply devices 41, 42, relative to the power ground 40, as a high-power output voltage 6.

The power part 5 is a device that is implemented, for example, with the power semiconductors 43, 44 in a half-bridge arrangement, to produce positive and/or negative voltage pulses from at least one voltage source, e.g. 41, 42, in which the current supply of a load, e.g. at the high-power output voltage 6, is interrupted with low loss and/or the polarity is changed, in cycles.

The degree of effectiveness of switching amplifiers is significantly influenced by the switching frequency. The switching losses of FET power switches increase with the voltage stress, in super-proportional manner. At least one D amplifier stage V2 to V5 that works at a low frequency, of an amplifier stage V6, supplies power for the bass speakers, while the significantly smaller power values for the higher speakers is supplied by a different D amplifier stage V2 to V5 of the amplifier stage V6, which works at a significantly higher switching frequency and a low supply voltage.

FIG. 13 shows the digital implementation of the regulator R1, as an example (see also FIG. 2). The data words of a supplied reference data stream 1, e.g. in the i2s format, are passed to the adder or mixer 13, by way of the converter 100, for example, and the prefilter 102, which can also be implemented as a decimation filter, possibly in serial manner. The mixer 13 possesses a positive or negative feedback input to which the error data stream 17 is supplied, and processes the data words of the input data streams 1', 17 to produce the data stream 1". The data stream 1" is converted to the digital data sequence 4 by the coding device 3, in such a manner that the value of the signal sequence 4 averaged over the duration of a switching period follows the data stream 1". The digital signal sequence 4 is amplified by a switching amplifier 5 (see also FIG. 12), to produce the high-power output voltage 6, whereby the control device 13 compensates the switching time errors or the change in the shape of the signal sequence 4 as the consequence of different switching times of the switching transistors 43, 44 of the power part 5. The digital signal sequence 4 that corresponds to the data stream 1" is taken over by the D latch of the converter 100 with every rising flank of the clock signal 110. The converter 100 converts the digital signal sequences of the reference data stream 1 in the I2S format, for example, which are synchronous with the clock signal 110, into a parallel or a serial data stream 101, which is converted into a data stream 1' having a different resolution and synchronicity, by a prefilter 102.

This data stream 1' is synchronous with the cycle signal 140, for example 176 kHz. This is also the synchronicity of the compensation data stream 17, which is obtained from a comparison of the digital signal sequence 4 with the high-power output voltage 6. The compensation data stream 17 is generated by the adder 111, which adds the values of the pulse widths of the error signals 15, with the correct prefix, which values are digitalized by the up/down counter 108. An integrator that is limited, in terms of time, to the switching period of the switching frequency, can be implemented with the counter 108.

The switching frequency of the D amplifier 5 is derived from the cycle signal 120, which is supplied to the counter 104 of the coding unit 3. The counter 104 generates the switching-frequency cycle 140, with which the counter 108 is controlled or reset. The output data stream 107 of the error pulse width digitalizer 108 is synchronous with the cycle 140. The error pulse width signal 15 is generated by the comparator 14, implemented as an XOR gate here, for example, to which the digital signal sequence 4 and the digital output voltage 11 of the attenuator 10 are supplied, to which the high-power output voltage 6 is fed back on the input side. The signal 15 at the output of the XOR 14 is only high at those times during which its inputs, in other words the signal 4 and the high-power output voltage 6, have different states. The data streams 1' and 17 that are synchronous to the cycle 140 are added in the mixer 13, which generates the data stream 1".

The words of the data stream 1" are checked for similarity with the values of the data stream 105, which is generated by the counter 104, in the comparator 103. The counter 104 and the RS flip-flop 106 are controlled by the cycle 140 (reset). A PWM modulation of the data stream 1" is performed by means of the counter 104, the comparator 103, the RS flip-flop 106, and the cycle 120.

Figure 14:
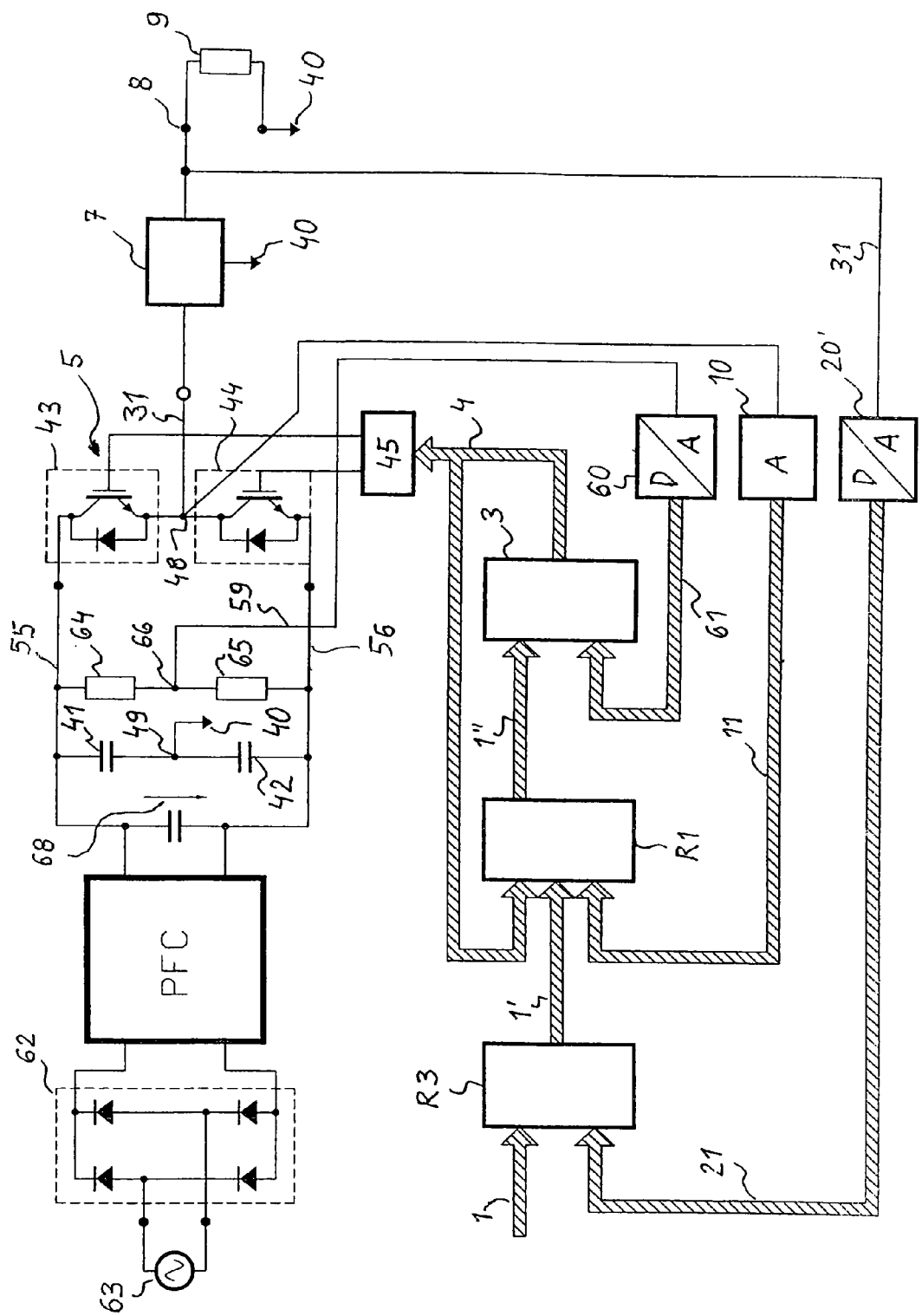
FIG. 14 another exemplary embodiment of an amplifier arrangement.

FIG. 14 shows an exemplary embodiment of a D amplifier having a sine-shaped power consumption. In this connection, the rectifier 62, which is connected with the network 63 on the input side and with the input of the PFC on the output side. The PFC regulates the average value of its output voltage between the lines 55, 56, to which the D amplifier 5 is connected, which is formed by the D stages 43, 44, in the case of a sine-shaped power consumption. Furthermore, a voltage splitter 64, 65 and a serial circuit of capacitors 41, 42 is connected with the two lines 55, 56, whereby the connecting point 49 of the two capacitors 41, 42, just like a connector of the consumer 9, is connected with the ground 40. The output 48 of the D amplifier stages 43, 44 is connected with the input of the D/A converter 7, which can also be configured as a filter, by way of a line 31, and with an attenuator 10, the output of which is connected with the loop R1, by way of a line 6. As already explained, the loop R1 processes the data stream 1' with the data stream 11 of the attenuator 10 and the data stream 4 of the coder 68 of the mixer/coder circuit 3, to produce the data stream 1".

A load 9, which can be formed by a loudspeaker, for example, is connected at the output of the D/A converter 7.

The voltage at the load is fed back to the loop R2 by way of the A/D converter 20, whereby the output data stream 21 of the A/D converter 20 is processed by the loop R2, with the input data stream 1, to produce the data stream 1'.

The voltage splitter 64, 65 connected with the intermediate circuit 55, 56, having the center connector 66, is connected with the input of the A/D converter 60, by way of the line 59. The output data stream 61 of the D/A converter 60 is also supplied to the mixer 67 of the mixer/coder circuit 3, just like the data stream 1". This results in a shortening/lengthening of the pulse width that is proportional to the positive/negative change in the intermediate circuit voltage, and thereby of the supply voltage of the D amplifier.

The output data stream 1" of the loop R1 is supplied to the mixer/coder circuit 3 together with the data stream 61 of the D/A converter 60, and coded by this circuit to produce the data stream 4, which is supplied to a driver circuit 45 that triggers the D amplifier stages 43, 44 of the D amplifier 5.

The invention claimed is:

1. Method for generating a high-power alternating voltage amplified by switching, that follows a digital input data stream in terms of shape and amplitude, whereby direct current from a direct-voltage supply fed from a sine-shaped current is provided as the power supply, and a digital signal that corresponds to the ripple of the direct current is mixed into a signal that corresponds to the input signal, wherein the input data stream is converted into a digital signal sequence (1, 1', 4), and this signal sequence (1, 1', 4) is amplified by switching, whereby a digital signal (11, 21, 21') is derived from the amplified output signal (6), and compared with a digital signal (1, 1', 4) that corresponds to the input data stream, and the amplification of the input data stream is influenced, in the sense of a congruency of the amplified signal with the input data stream, by means of switching by a digital difference signal that might be determined.

2. A device for generating a high-power alternating voltage that follows a digital input data stream in terms of shape and amplitude comprising:
    (a) at least one D amplifier having a direct-voltage supply;
    (b) a voltage splitter connected with said direct-voltage supply having a center tap;
    (c) a mixer/coder circuit having a first input, a second input, and an output, said first input being connected with said center tap by way of an A/D converter and said output being connected with said at least one D amplifier;
    (d) a D/A converter connected with a load, said at least one D amplifier being connected with the load by way of said D/A converter; and
    (e) a digitally functioning first loop comprising a comparator and a control device, said comparator having a first comparator input with an unamplified, digital signal corresponding to the input data stream applied to the first comparator input, a second comparator input with a digital signal corresponding to an output signal of said at least one D amplifier applied to the second comparator input, and a comparator output connected with the second input of the mixer/decoder circuit by way of said control device.

3. The device according to claim 2, wherein the loop is preceded by a predictor that has the input data stream applied to the predictor on an input side, and signals applied to the predictor, at least part of the time, which are derived from a signal segment that follows the load.

4. The device according to claim 2, wherein the second comparator input is connected with an output of the at least one D amplifier by way of an attenuator, and the first comparator input is connected with the output of the mixer/ coder circuit, whereby the comparator is connected, on an output side, with the control device, by way of a coder.

5. The device according to claim 2, wherein the second comparator input is connected with an output of the at least one D amplifier by way of a converter, to convert a digital signal sequence into data words, and the first comparator input has an unamplified digital signal that corresponds to the input data stream applied to the first comparator input.

6. The device according to claim 2, wherein the second comparator input is connected with an output of the D/A converter that follows the D amplifier by way of the A/D converter, and the first comparator input has an unamplified, digital signal that corresponds to the input data stream applied to the first comparator input by way of a prefilter.

7. The device according to claim 4, wherein in order to implement an amplifier stage, a second digitally functioning loop comprising a second comparator and a second control device follows the first loop, whereby the output of the first loop is connected with a second input of the second control device of the second loop.

8. The device according to claim 4, wherein in order to implement an amplifier stage, a second digitally functioning loop comprising a second comparator and a second control device follows the first loop, whereby the output of the first loop is connected with a second input of the second control device of the second loop.

9. The device according to claim 4, wherein in order to implement an amplifier stage, a second digitally functioning loop comprising a second comparator and a second control device follows a third digitally functioning loop comprising a third comparator and a third control device, which in turn follows the first loop, whereby the output of the first loop is connected with a second input of the third control device of the third loop, and the output of the third loop is connected with a second input of the second control device of the second loop.

10. The device according to claim 7, wherein a plurality of amplifier stages are implemented and at least two of the amplifier stages are switched in parallel, whereby a multiplexer precedes them.

* * * * *